(12) United States Patent  
Hayasaka (10) Patent No.: US 11,385,284 B2  
(45) Date of Patent: Jul. 12, 2022

(54) TEST SYSTEM AND TEST METHOD

(71) Applicant: Kioxia Corporation, Minato-ku (JP)

(72) Inventor: Kazuhito Hayasaka, Minato (JP)

(73) Assignee: Kioxia Corporation, Minato-ku (JP)

( * ) Notice: Subject to any disclaimer, the term of this patent is extended or adjusted under 35 U.S.C. 154(b) by 235 days.

(21) Appl. No.: 16/807,223

(22) Filed: Mar. 3, 2020

(65) Prior Publication Data

US 2021/0072308 A1 Mar. 11, 2021

(30) Foreign Application Priority Data

Sep. 11, 2019 (JP) .............................. JP2019-165175

(51) Int. Cl.
*G01R 31/28* (2006.01)

(52) U.S. Cl.
CPC ..... *G01R 31/2887* (2013.01); *G01R 31/2894* (2013.01)

(58) Field of Classification Search
CPC ............ G01R 31/2887; G01R 31/2894; G01R 31/2834
USPC ..................................................... 324/756.07
See application file for complete search history.

(56) References Cited

U.S. PATENT DOCUMENTS

| 5,130,646 A | 7/1992 | Kojima | |
|---|---|---|---|
| 2004/0143411 A1* | 7/2004 | Wu | G01R 31/01 702/117 |

FOREIGN PATENT DOCUMENTS

| JP | 62-285075 A | 12/1987 | |
|---|---|---|---|
| JP | 03-170885 A | 7/1991 | |
| JP | 2004-257921 A | 9/2004 | |
| JP | 2013024569 A * | 2/2013 | ............. G01R 31/26 |

OTHER PUBLICATIONS

Equivalent English translation provided by Espacenet JP2013024569 (Year: 2013).*

* cited by examiner

*Primary Examiner* — Jermele M Hollington
*Assistant Examiner* — Courtney G McDonnough
(74) *Attorney, Agent, or Firm* — Oblon, McClelland, Maier & Neustadt, L.L.P.

(57) ABSTRACT

A test system includes: a test board on which a plurality of test target devices are mounted while being sequentially connected to one another; a measuring apparatus configured to simultaneously execute direct current tests for the test target devices mounted on the test board; and a determining apparatus configured to determine whether or not the test target devices are acceptable. The measuring apparatus executes the direct current tests every time when the number of test target devices mounted on the test board changes. The measuring apparatus determines whether or not the test target devices are acceptable on the basis of a change between measured values of the direct current tests, which follows the change of the number of test target devices mounted on the test board.

15 Claims, 11 Drawing Sheets

TEST SYSTEM AND TEST METHOD

CROSS REFERENCE TO RELATED APPLICATIONS

This application is based upon and claims the benefit of priority from prior Japanese Patent Application P2019-165175 filed on Sep. 11, 2019; the entire contents of which are incorporated by reference herein.

FIELD

Embodiments described herein relate generally to a test system of a semiconductor device and a test method thereof.

BACKGROUND

For a semiconductor device, performed are a burn-in test for suppressing an occurrence of an initial failure, a reliability test for verifying reliability of a product, and the like. For example, in the burn-in test, a test board in which a plurality of semiconductor devices are connected to one wiring is used.

Before the burn-in test and the reliability test, it is necessary to previously exclude semiconductor devices as defective products from test targets. In the test board with the above-described configuration, current values and voltage values are measured for each wiring in a DC parametric test for inspecting direct current characteristics of the semiconductor devices. Therefore, the direct current characteristics of the individual semiconductor devices cannot be determined. That is, it is difficult to determine whether or not each of the semiconductor devices passes the DC parametric test. Note that the DC parametric test includes a power supply current test, a voltage application current measurement and a current application voltage measurement for input/output terminals, and the like. Hereinafter, the DC parametric test will also be referred to as a "direct current test".

Moreover, in order to determine whether or not each of the semiconductor devices passes the DC parametric test, also conceived is a method of performing the DC parametric test for each of a total number of the semiconductor devices. However, a test time is increased in accordance with this method. Moreover, an expensive test system is required to simultaneously drive a large number of the semiconductor devices and perform the measurement for the same, leading to an increase of test cost.

DETAILED DESCRIPTION

A test system according to embodiments includes: a test board on which a plurality of test target devices are mounted while being sequentially connected to one another; a measuring apparatus configured to simultaneously execute direct current tests for the test target devices mounted on the test board; and a determining apparatus configured to determine whether or not the test target devices are acceptable. The measuring apparatus executes the direct current tests every time when the number of test target devices mounted on the test board changes. The measuring apparatus determines whether or not the test target devices are acceptable on the basis of a change between measured values of direct current tests, which follows the change of the number of test target devices mounted on the test board.

Hereinafter, a description will be given of the embodiments with reference to the drawings. In the description of the drawings, the same reference numerals are assigned to the same portions, and a description thereof is omitted.

First Embodiment

Figure 1:
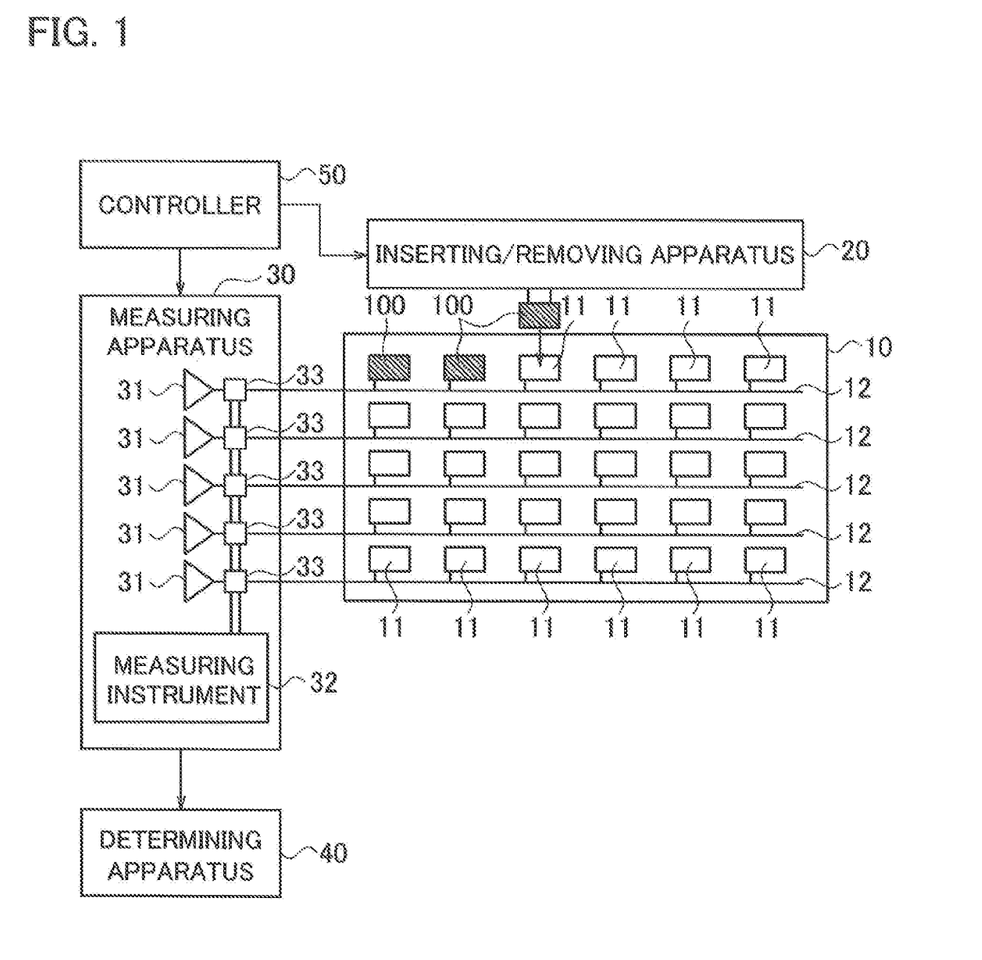
FIG. 1 is a schematic diagram illustrating a configuration of a test system according to a first embodiment.

As illustrated in FIG. 1, a test system according to a first embodiment of the present invention includes: a test board 10 on which test target devices 100 are mounted; an inserting/removing apparatus 20 configured to transfer the test target devices 100 to the test board 10; a measuring apparatus 30 configured to simultaneously execute a direct current test for the test target devices 100 mounted on the test board 10; and a determining apparatus 40 configured to determine whether or not the test target devices 100 are acceptable on the basis of a result of the direct current test.

The test board 10 includes a plurality of test sockets 11 sequentially connected to one another, and mounts the test target devices 100 thereon in a state in which the test target devices 100 are individually inserted into the test sockets 11. Thus, a plurality of the test target devices 100 are mounted on the test board 10 while being sequentially connected to one another. In FIG. 1, the test target devices 100 are illustrated by being hatched (the same applies to the following). The test sockets 11 are electrically connected to one another by a board wiring 12 disposed on the test board 10. Though not illustrated, the test sockets 11 are provided with connection terminals configured to electrically connect to terminals of the test target devices 100, and these connection terminals are connected to the board wiring 12.

The inserting/removing apparatus 20 sequentially transfers the test target devices 100 to the test board 10. Then, the inserting/removing apparatus 20 inserts and removes the test target devices 100 into and from the test sockets one by one. Hereinafter, to transfer the test target devices 100 to the test board 10 and insert the test target devices 100 into the test sockets 11 will also be referred to as to mount the test target devices 100 on the test board 10. As illustrated by an arrow, FIG. 1 illustrates a stage of mounting a third test target device 100 on the test board 10.

As illustrated in FIG. 1, the board wiring 12 has a configuration in which a plurality of branch wirings, each having a plurality of the test sockets 11 connected in series to one another, are connected in parallel to one another. One end portion of each of the branch wirings is connected to the measuring apparatus 30.

The measuring apparatus 30 is electrically connected to the test sockets 11 by the board wiring 12. Drivers 31 of the measuring apparatus 30 supply power and a signal to the test target devices 100 through the branch wirings of the board wiring 12 and the test sockets 11, and simultaneously operate the test target devices 100 mounted on the test board 10. In accordance with the test board 10 illustrated in FIG. 1, one driver 31 is used for the plurality of test target devices 100. Therefore, such a measuring apparatus 30 in which the number of drivers 31 is small can be used, and so on, and cost of the test can be suppressed. The power and the signal from the drivers 31 are supplied to the test board 10 through switching circuits 33.

Every time when the number of test target devices 100 inserted into the test sockets 11 changes, the measuring apparatus 30 executes the direct current test simultaneously for all the test target devices 100 inserted into the test sockets 11.

Measured values of the direct current test are measured by a measuring instrument 32 of the measuring apparatus 30 connected to the board wiring 12. The measuring instrument 32 is, for example, an ammeter, a voltmeter or the like. For example, in a power supply current measurement and a voltage application current measurement, an ammeter is used for the measuring instrument 32, and in a current application voltage measurement, a voltmeter is used for the measuring instrument 32. The measured value of the direct current test by the measuring apparatus 30 is measured as a total sum of measured values of all the test target devices 100 mounted on the test board 10 and connected to the board wiring 12 at a time of executing the direct current test. The measured value from the test board 10 is transmitted to the measuring instrument 32 through the switching circuit 33. As described above, the switching circuit 33 switches between the supply of the power and the signal from the drivers 31 to the test board 10 and the transmission of the measured value from the test board 10 to the measuring instrument 32.

The inserting/removing apparatus 20 and the measuring apparatus 30 are controlled by a controller 50. That is, the controller 50 controls the inserting/removing apparatus 20 to insert and remove the test target devices 100 into and from the test sockets 11 one by one. Then, the controller 50 controls the measuring apparatus 30 to execute the direct current test every time when the number of test target devices 100 inserted into the test sockets 11 changes. Thus, while inserting and removing the test target devices 100 into and from the test sockets 11 one by one, the test system illustrated in FIG. 1 executes the direct current test every time when the number of test target devices 100 inserted into the test sockets 11 changes.

The measuring apparatus 30 transmits the measured value of the direct current test to the determining apparatus 40. The determining apparatus 40 determines whether or not the test target devices 100 are acceptable on the basis of a change between the measured values of the direct current tests, which follows the change of the number of test target devices 100 inserted into the test sockets 11.

Figure 2:
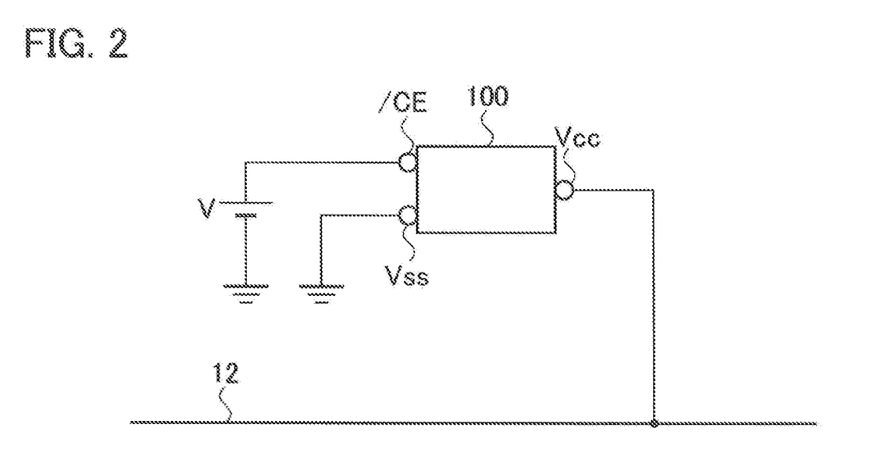
FIG. 2 is a schematic diagram illustrating an example of a measuring circuit in a direct current test.

For the test target devices 100, for example, the measuring apparatus 30 measures leakage current value and voltage value at input/output terminals, a power supply current value, and the like. For example, by the measuring circuit illustrated in FIG. 2, a power supply current (standby current) when a NAND-type flash memory as the test target device 100 does not operate is measured. In the measuring circuit illustrated in FIG. 2, a predetermined voltage V is applied to a /CE terminal of the NAND-type flash memory, and a Vss terminal thereof is grounded. Then, a Vcc terminal of the NAND-type flash memory is connected to the board wiring 12, and the measuring instrument 32 measures a value of a current flowing when the voltage is applied to the Vcc terminal by the driver 31.

Figure 3:
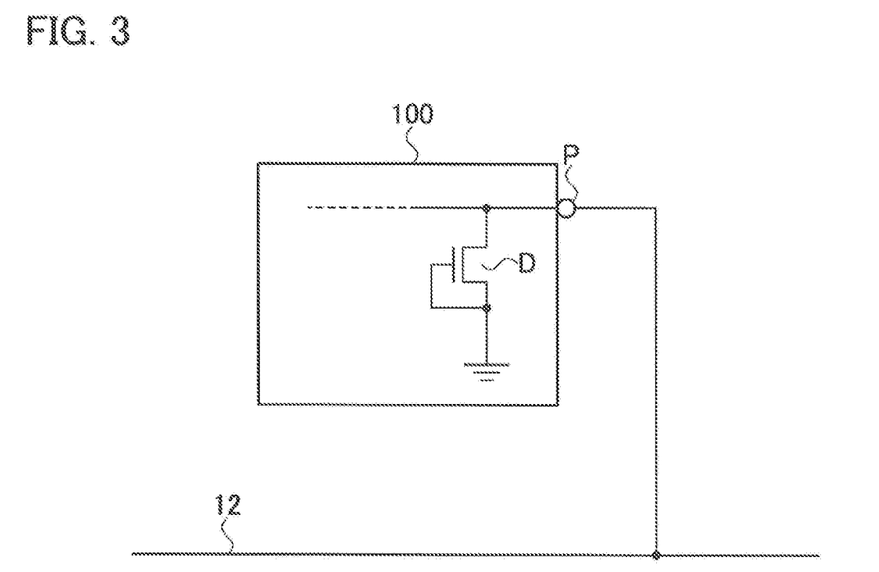
FIG. 3 is a schematic diagram illustrating another example of the measuring circuit in the direct current test.

Alternatively, by a measuring circuit illustrated in FIG. 3, a leakage current at an input terminal P is measured. In the measuring circuit illustrated in FIG. 3, in a normal state, a current hardly flows into a transistor D that is connected to the input terminal P and operates like a diode as an electrostatic protection element, and also as an input circuit, a current flowing to the input terminal P remains within a slight current value within a prescribed value of a leakage current guaranteed by a manufacturer. However, when a leakage current occurs in an element such as an input transistor (not shown) or a wiring, which connects to the transistor D and the input terminal P, the leakage current is measured as an abnormal current by the measuring apparatus 30.

Figure 4:
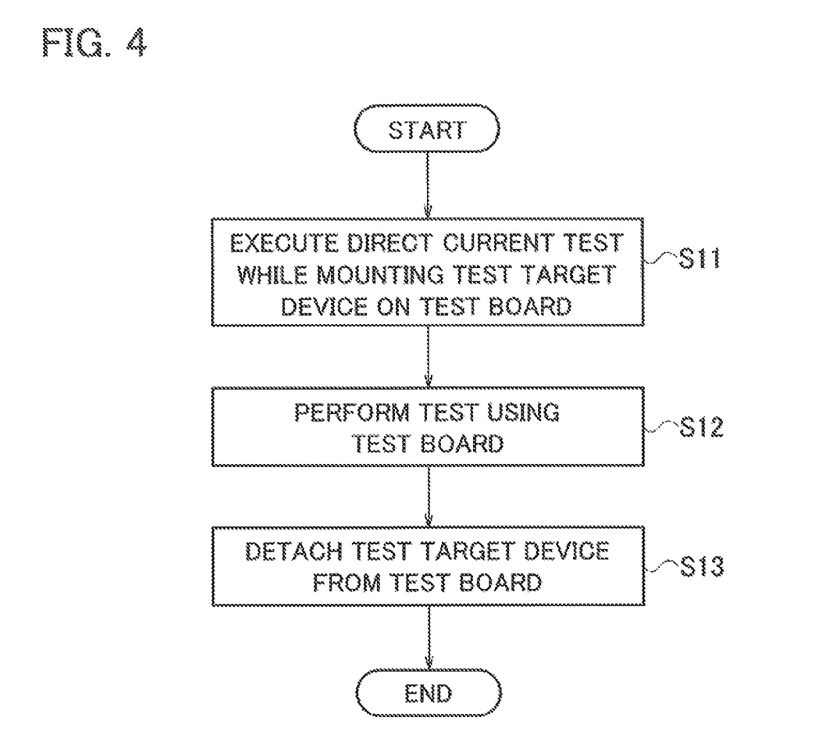
FIG. 4 is a flowchart illustrating an example of a test process that uses the test system according to the first embodiment.

The test system illustrated in FIG. 1 is used, for example, in a test process illustrated in FIG. 4. In the test process illustrated in FIG. 4, in Step S11, the direct current test by the test system illustrated in FIG. 1 is executed while mounting the test target device 100 on the test board 10. Thereafter, in Step S12, a test is performed for the test target devices 100 mounted on the test board 10. For example, a burn-in test in which a temperature and an operation time are set to predetermined conditions is performed. Thereafter, in Step S13, the test target devices 100 are detached from the test board 10.

In a direct current test using the test board 10 in which the plurality of test target devices 100 are connected to one board wiring, the current value and the voltage value are measured for each of the board wirings. Hence, in a state in which all the test target devices 100 are mounted on the test board 10, it is difficult to determine whether or not the direct current characteristics of each of the test target devices 100 are acceptable. Therefore, there is a possibility that the burn-in test or the like will be executed in a state in which such a test target device 100 of which direct current characteristics do not meet predetermined criteria is mounted on the test board 10.

In contrast, in the test system illustrated in FIG. 1, the direct current test is executed every time when one test target device 100 is inserted or removed into or from the test socket 11, and it is determined whether or not the direct current characteristics of each of the test target devices 100 is acceptable by using the change between the measured values of the direct current tests. Hereinafter, detailed operations of the test system illustrated in FIG. 1 will be described.

Figure 5:
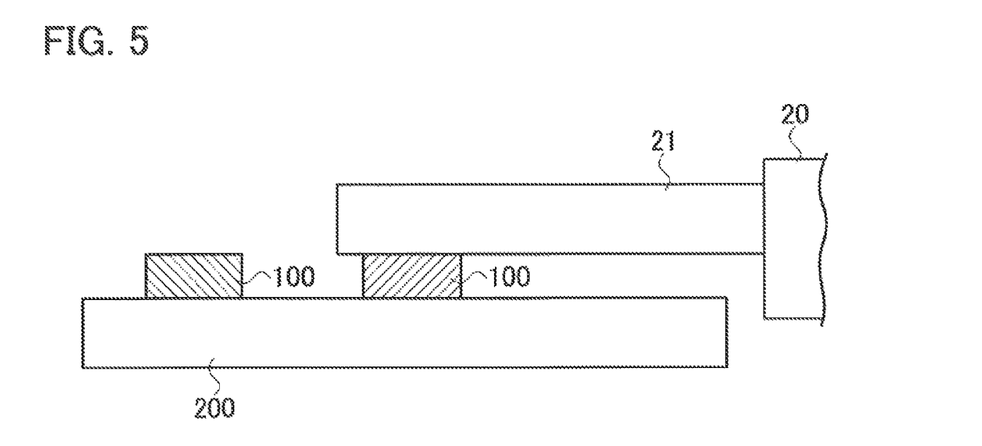
FIG. 5 is a schematic view illustrating an example of a mounting method of test target devices.

First, the inserting/removing apparatus 20 inserts the test target devices 100 into the test sockets 11 one by one. For example, as illustrated in FIG. 5, the inserting/removing apparatus 20 sucks and lifts one of the test target devices 100, which is mounted on a tray 200, by a robot arm 21. Then, the inserting/removing apparatus 20 conveys the test target device 100 to the test board 10 by the robot arm 21, and inserts the test target device 100 into the test socket 11. As described above, the inserting/removing apparatus 20 functions as an inserter, and one by one, adds the test target devices 100 to be mounted on the test board 10.

Then, every time when the test target devices 100 inserted into the test sockets 11 are increased, the measuring apparatus 30 executes the direct current test.

The determining apparatus 40 calculates a change between a measured value of a latest direct current test, which is transmitted from the measuring apparatus 30, and a measured value of a previous direct current test, which is transmitted immediately therebefore. Then, the determining apparatus 40 determines whether or not the test target device 100 newly inserted into the test socket 11 is acceptable by comparison between a predetermined difference determination value and the change between the measured values of the direct current tests. Hereinafter, a defective product in the direct current characteristics will also be referred to as a "DC defective product", and an acceptable product in the direct current characteristics will also be referred to as a "DC acceptable product".

Specifically, the determining apparatus 40 compares the difference determination value and the change between the measured values of the direct current tests, which is caused by the fact that the test target devices 100 inserted into the test sockets 11 are increased by one, with each other. When the change between the measured values of the direct current tests is larger than the difference determination value, the determining apparatus 40 determines that the test target device 100 (hereinafter, referred to as an "additional device") newly inserted into the test socket 11 is a DC defective product. In consideration of a measurement error and the like, the difference determination value is set in response to direct current characteristics of a single piece of such acceptable test target devices 100. That is, when the additional device is a DC defective product, a range of the difference determination value is set so that the change between the measured values of the direct current tests exceeds the range of the difference determination value.

Here, a description is given of a case in which the direct current test by the measuring apparatus 30 is a test for measuring the power supply currents of the test target devices 100. For example, for the NAND-type flash memories, the measuring apparatus 30 measures standby currents thereof. In this case, if all the test target devices 100 are acceptable products, then such changes between the measured values of the direct current tests, which are caused by the fact that the test target devices 100 inserted into the test sockets 11 are increased by one, are even. That is, a magnitude of the change between the measured values corresponds to a measured value of the single piece of the acceptable test target devices 100.

Figure 6:
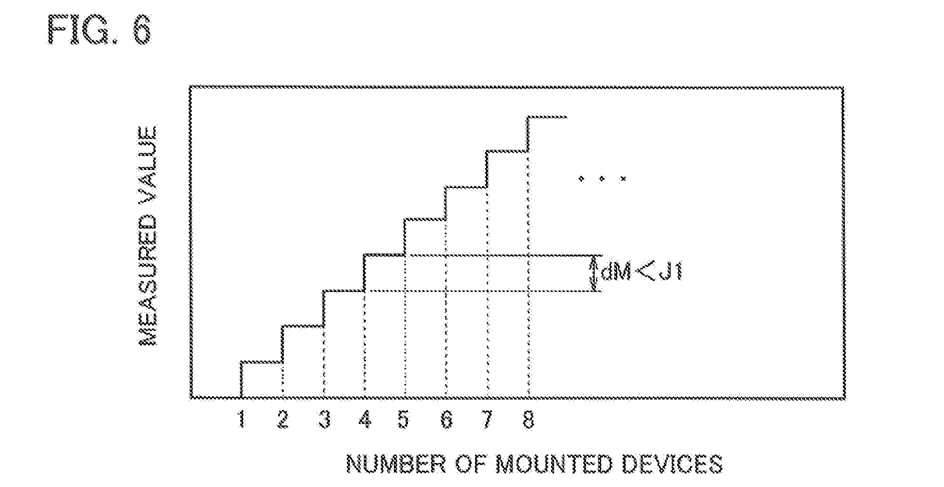
FIG. 6 is a graph illustrating an example of a measurement result when a defective product is not included in the test target devices.

Hence, when such a defective product in the direct current characteristics is not included in the test target devices 100 mounted on the test board 10, then as illustrated in FIG. 6, a change dM between the measured values of the direct current tests at each measurement time remains within a range of such a difference determination value J1.

Meanwhile, when a new additional device is a DC defective product, a change between measured values of the direct current tests differs from that in a case in which the additional device is a DC acceptable product. For example, when a test target device 100 as a DC defective product in which a leakage current occurs in a power supply terminal is added to the test board 10, an increment of the measured current value is larger than in a case in which a test target device 100 as a DC acceptable product is added to the test board 10.

Figure 7:
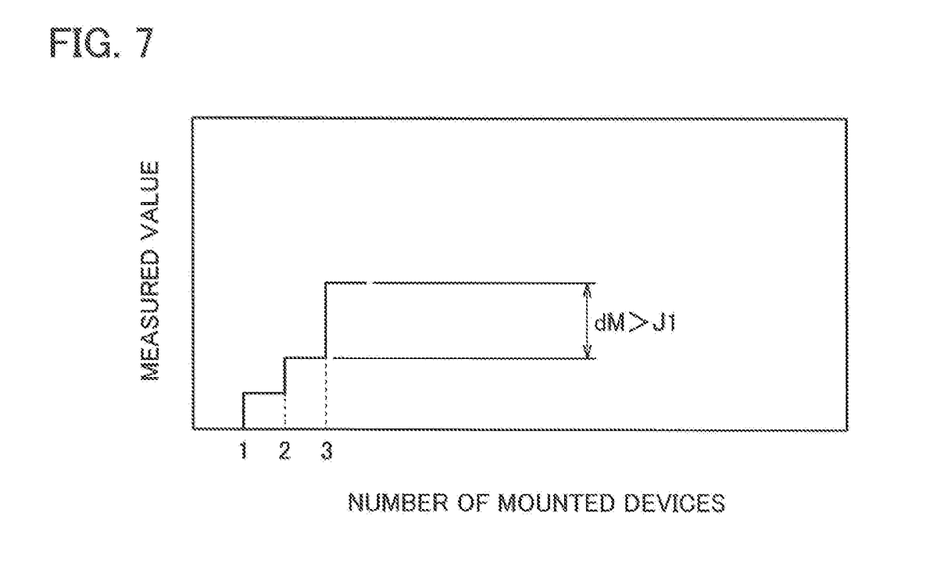
FIG. 7 is a graph illustrating an example of a measurement result when a defective product is included in the test target devices.

FIG. 7 illustrates an example in which the test target device 100 added to the test board 10 is the DC defective product. In an example illustrated in FIG. 7, the change dM between measured values of a second direct current test and a third direct current test is larger than the difference determination value J1, and a test target device 100 added as a third device is a DC defective product.

From the determining apparatus 40, the controller 50 is notified of a result of a determination as to whether or not the direct current characteristics of the test target device 100 are acceptable, the result being obtained by the direct current test. When the result of the direct current test is defective, the controller 50 controls the inserting/removing apparatus 20 to remove the test target device 100, which is determined to be a DC defective product, from the test socket 11, and to detach the test target device 100 from the test board 10. The DC defective product is conveyed, for example, to a defective product-dedicated tray or the like, and is made distinguishable from DC acceptable products. Hereinafter, processing for distinguishing the DC defective product from the DC acceptable products as described above will be referred to as "DC defective product processing". After the DC defective product processing, a new test target device 100 is inserted into the test socket 11 by the inserting/removing apparatus 20, and the measuring apparatus 30 executes the direct current test.

Meanwhile, when the result of the direct current test is acceptable, the controller 50 controls the inserting/removing apparatus 20 to insert the new test target device 100 into the test socket 11, and controls the measuring apparatus 30 to execute the direct current test.

Figure 8:
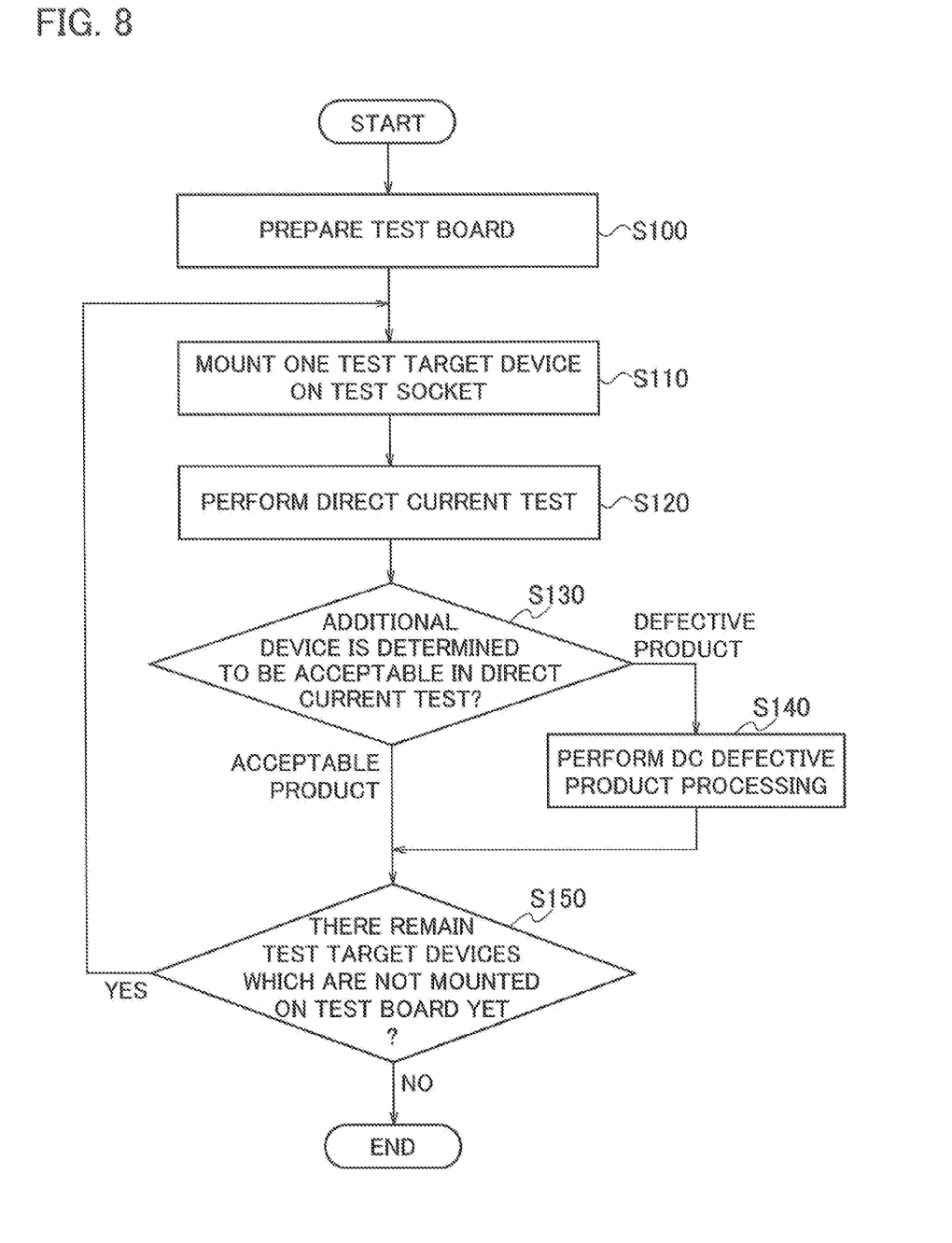
FIG. 8 is a flowchart for explaining a test method according to the first embodiment.

Referring to FIG. 8, a description will be given below of a test method using the test system illustrated in FIG. 1. First, in Step S100, prepared is the test board 10 in which the plurality of test sockets 11 sequentially connected to one another are arranged. Then, in Step S110, the inserting/removing apparatus 20 inserts one test target device 100 into the test socket 11. Then, in Step S120, the measuring apparatus 30 executes the direct current test for the test target device 100 mounted on the test board 10. The measured value of the direct current test is transmitted to the determining apparatus 40.

In Step S130, the determining apparatus 40 determines whether or not the additional device is acceptable on the basis of the measured value of the direct current test. That is, when the change between the measured values of the direct current tests exceeds a predetermined range of the difference determination value, the determining apparatus 40 determines that the additional device is the DC defective product. When the additional device is the DC defective product, the processing proceeds to Step S140. Meanwhile, when the change between the measured values of the direct current tests remains within the range of the difference determination value, the determining apparatus 40 determines that the additional device is the DC acceptable product. When the additional device is the DC acceptable product, the processing proceeds to Step S150.

In Step S140, executed is such DC defective product processing as detachment of the additional device, which is determined to be the DC defective product, from the test board 10. Thereafter, the processing proceeds to Step S150.

In Step S150, it is determined whether or not there remain such test target devices 100 which are not mounted on the test board 10 yet. For example, the controller 50 determines whether or not the number of test target devices 100 mounted on the test board 10 has reached a predetermined number. When there remain the test target devices 100 which are not mounted on the test board 10 yet, the processing returns to Step S110. Meanwhile, when there do not remain such test target devices 100 which are not mounted on the test board 10 yet, the processing is ended.

When the DC parametric test of the test target devices 100 is not executed, for example, there is a possibility that the burn-in test will be performed in a state in which an assembly defective product or the like is mounted on the test board 10. In that case, the test is not sometimes executed as appropriate since the test target devices 100 do not operate as desired during the test.

For example, when a power feed system of the test board 10 nearly short-circuits due to the assembly defective product, a predetermined power supply voltage is not applied to the test target devices 100 under the burn-in test. That is, a voltage with a level dropped more than the predetermined voltage will be applied to the test target devices 100. For example, this results in an increase of blocks (bad blocks) unusable in the NAND-type flash memory. Moreover, when the input terminal or output terminal of each of the test target devices 100 short-circuits with the power supply terminal or a ground terminal, and so on, the test target device 100 passes through the burn-in test without a predetermined stress being applied to the test target device 100. As a result, the test target device 100 becomes defective soon after having appeared in the market, and this is regarded as a problem.

Moreover, in a monitored burn-in apparatus, at a time when a measured value that is monitored and an expected value are compared with each other, the test target device 100 as the DC defective product sometimes inhibits accurate measurement of a measured value of another test target device 100 connected to the same wiring as that for the DC defective product itself.

Meanwhile, in accordance with the test system illustrated in FIG. 1, the DC defective product as the test target device 100 can be eliminated from the test board 10 by the direct current test described above. Then, subsequent tests are executed by using the test board 10 on which the DC acceptable products as the test target devices 100 are mounted. That is, the burn-in test and the like are executed in a state in which a predetermined stress is appropriately applied to the test target devices 100.

After the tests of the test target devices 100 in the state of being mounted on the test board 10 are executed, the inserting/removing apparatus 20 functions as an extractor, and detaches each of the test target devices 100 from the test board 10. For example, the inserting/removing apparatus 20 sucks the test target device 100 by the robot arm 21, and removes the test target device 100 from the test socket 11. Then, the inserting/removing apparatus 20 conveys the test target device 100 from the test board 10 to the tray 200 in a state in which the test target device 100 is sucked to the robot arm 21.

As described above, in the test system illustrated in FIG. 1, every time when the test target device 100 is added to the test board 10, the direct current test is executed for the whole of all the test target devices 100 mounted on the test board 10 at that point of time. The measured values of the direct current tests before and after the test target device 100 is added are compared with each other, thus making it possible to determine whether or not the direct current characteristics of the added test target device 100 are acceptable. The inserting/removing apparatus 20 has a function to insert the test target devices 100 into the test sockets 11 of the test board 10 one by one. Moreover, the inserting/removing apparatus 20 has a function to, before inserting a new test target device 100 into the test socket 11, remove the test target device 100, which is inserted into the test socket 11 and determined to be a defective product immediately therebefore, from the test socket 11.

As described above, in accordance with the test system illustrated in FIG. 1, the direct current characteristics can be inspected for the individual test target devices 100 in the state in which the test target devices 100 are mounted on the test board 10. The test target devices 100 determined to be the DC defective products are detached from the test board 10. Hence, such a DC defective product as an assembly-defective test target device 100 can be prevented from proceeding to subsequent steps. As a result, the test of the test target devices 100 can be executed in an appropriate bias state.

The test system illustrated in FIG. 1 can be suitably used for a test using the test board 10 in which the plurality of test target devices 100 are sequentially connected to one another. In accordance with the test using the test board 10 that operates the plurality of test target devices 100 by one driver 31, the cost of the test can be suppressed. Moreover, the DC defective product as the test target device 100 can be eliminated at the stage at which the DC defective product is mounted on the test board 10, and accordingly, the burn-in test using the test board 10 on which the test target devices 100 are mounted can be performed appropriately.

The test target devices 100 may be semiconductor chips such as the NAND-type flash memories, or may be modules on each of which a plurality of the semiconductor chips are mounted. For example, the test system according to the embodiment can be applied to a test of solid-state drives (SSDs) each including a nonvolatile semiconductor storage element chip such as the NAND-type flash memory, a volatile semiconductor storage element chip such as a static random access memory (SRAM) and a dynamic random access memory (DRAM), and a memory controller.

MODIFIED EXAMPLE

When the measured value of the direct current test exceeds the difference determination value due to a connection failure between the test target device 100 and the test socket 11, there is a possibility that the test target device 100 as the DC acceptable product will be erroneously determined to be the DC defective product. Therefore, the insertion of the additional device into the test socket 11 may be redone in response to the measured value of the direct current test. Thus, such an erroneous determination in the determination as to whether or not the additional device is acceptable can be suppressed.

Figure 9:
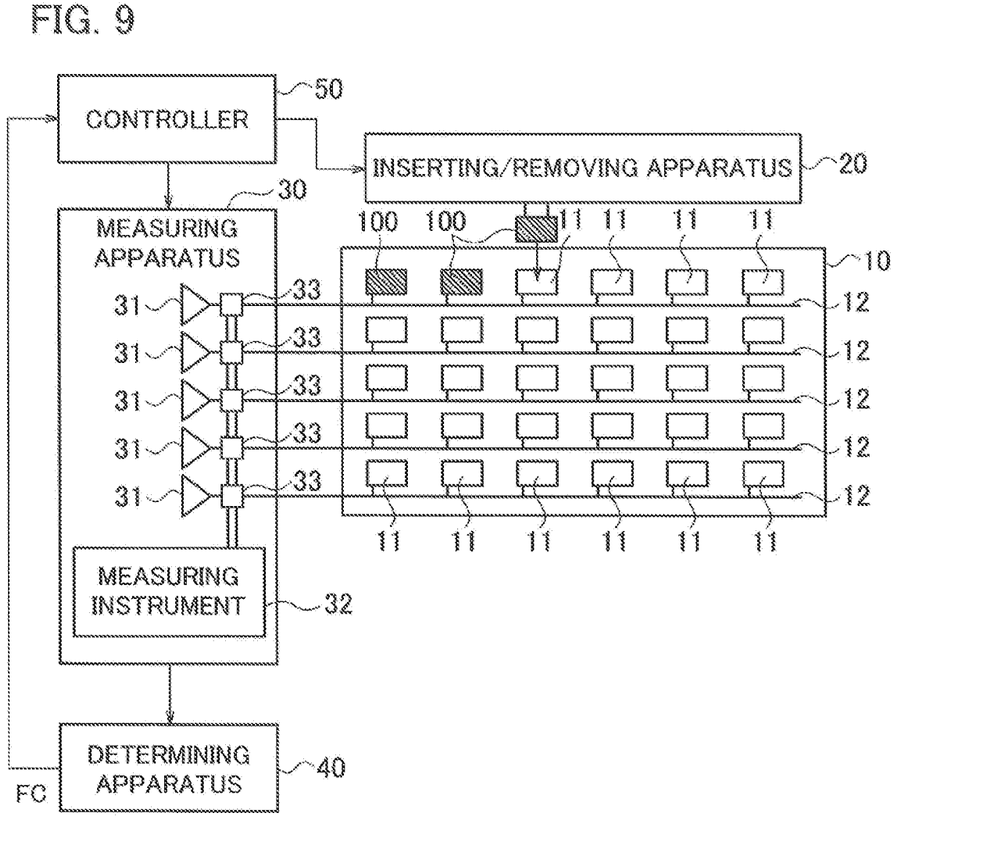
FIG. 9 is a schematic diagram illustrating a configuration of a test system according to a modified example of the first embodiment.

That is, when it is determined that the connection failure between the additional device and the test socket 11 occurs, the determining apparatus 40 notifies the controller 50 of a connection failure signal FC as illustrated in FIG. 9. The controller 50 notified of the connection failure signal FC controls the inserting/removing apparatus 20 to redo the insertion of the additional device into the test socket 11. Thereafter, the controller 50 controls the measuring apparatus 30 to execute the direct current test anew. Therefore, the erroneous determination caused by the connection failure between the test target device 100 and the test socket 11 can be suppressed.

Specifically, when the measured value of the direct current test remains within a predetermined range of a connection determination value, the determining apparatus 40 determines that the connection failure between the additional device and the test socket 11 does not occur. The connection determination value is set in response to a change between the measured values of direct current tests when the additional device and the test socket 11 causes the connection failure. For example, the connection determination value is set so that a change between measured values of direct current tests when the additional device and the test socket 11 are connected normally to each other remains within the range of the connection determination value.

Figure 10:
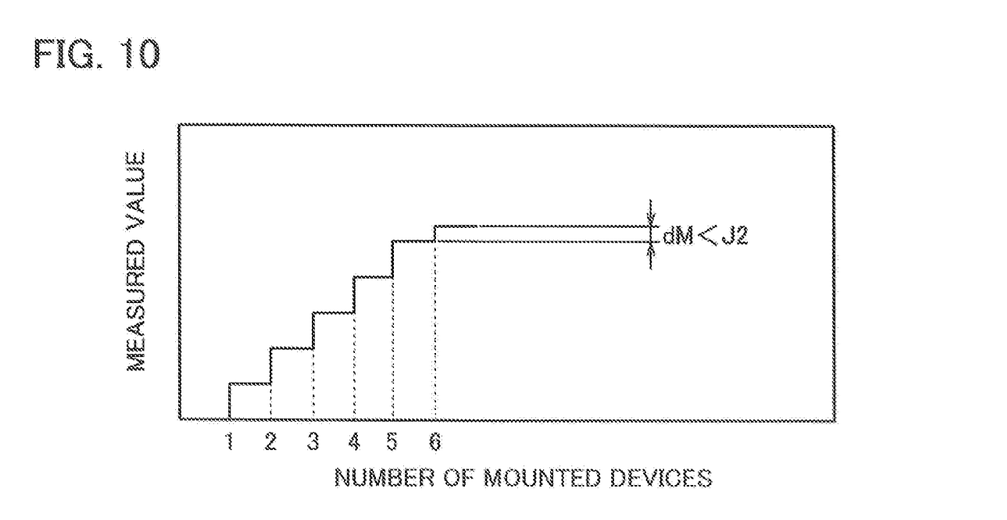
FIG. 10 is a graph illustrating an example of a measurement result when a connection failure between the test target device and a test socket occurs.

Therefore, when the change between the measured values of the direct current tests is larger than the difference determination value, the additional device is determined to be a DC defective product, and when the change between the measured values of the direct current tests is smaller than the connection determination value, the connection failure between the additional device and the test socket 11 is determined to occur. FIG. 10 illustrates an example in which the connection failure between the additional device and the test socket 11 occurs.

In the example illustrated in FIG. 10, a change dM between measured values of a fifth direct current test and a sixth direct current test is smaller than such a connection determination value J2. Therefore, the determining apparatus 40 determines that there occurs a connection failure between a test target device 100 added as a sixth device and the test socket 11.

Figure 11:
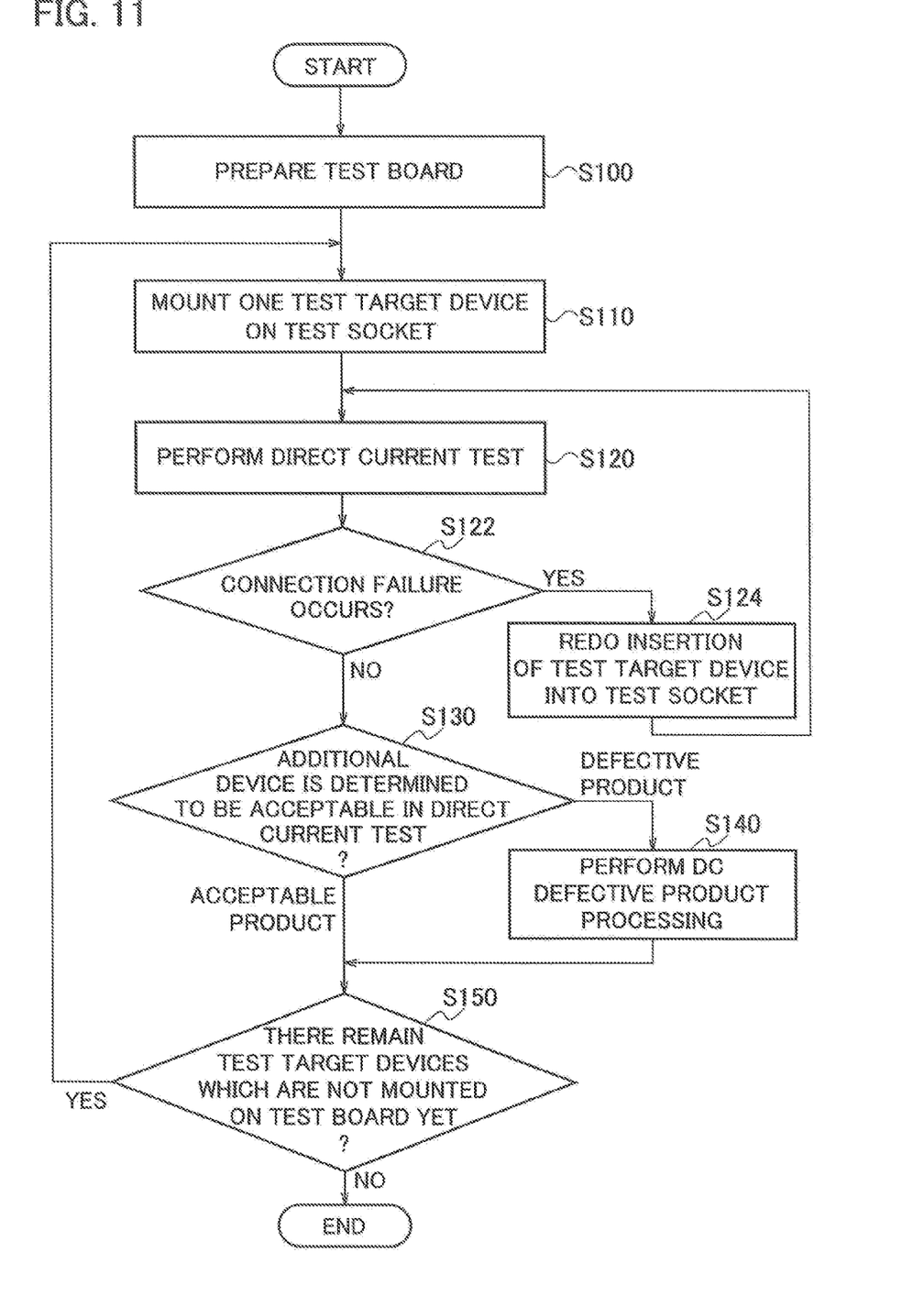
FIG. 11 is a flowchart for explaining a test method according to the modified example of the first embodiment.

FIG. 11 illustrates a flowchart of a test method also including the determination of the connection failure. In the flowchart illustrated in FIG. 11, from Step S100 to Step S120, the processing proceeds similarly to the method described with reference to the flowchart illustrated in FIG. 8. Then, in Step S122 after the direct current test is executed in Step S120, the determining apparatus 40 determines whether or not the connection failure between the additional device and the test socket 11 occurs on the basis of the comparison between the measured value of the direct current test and the connection determination value. When the connection failure occurs, the processing proceeds to Step S124, where the insertion of the additional device into the test socket 11 is redone. Thereafter, the processing returns to Step S120, where the measuring apparatus 30 executes the direct current test.

Meanwhile, when the determining apparatus 40 determines in Step S122 that the connection failure between the additional device and the test socket 11 does not occur, the processing proceeds to Step S130. Other steps are similar to those in the processing described with reference to the flowchart illustrated in FIG. 9.

As described above, in accordance with the test system illustrated in FIG. 9, when the connection failure between the test socket 11 and the test target device 100 is detected, the direct current test is executed after the insertion of the test target device 100 into the test socket 11 is redone. That is, two types of determination values, which are the connection determination value and the difference determination value, are set, whereby the test target device 100 can be suppressed from being erroneously determined to be the DC defective product. Such a mechanism of redoing the mounting of the test target device 100 on the test board 10 is incorporated into the test system, whereby the direct current test can be executed while appropriately mounting the test target device 100 on the test board 10. Thus, yield is also improved. Note that the test system may be set so that, when the number of times that the same test target device 100 is determined to cause the connection failure reaches a predetermined number, the test target device 100 is determined to be the DC defective product.

Second Embodiment

Figure 12:
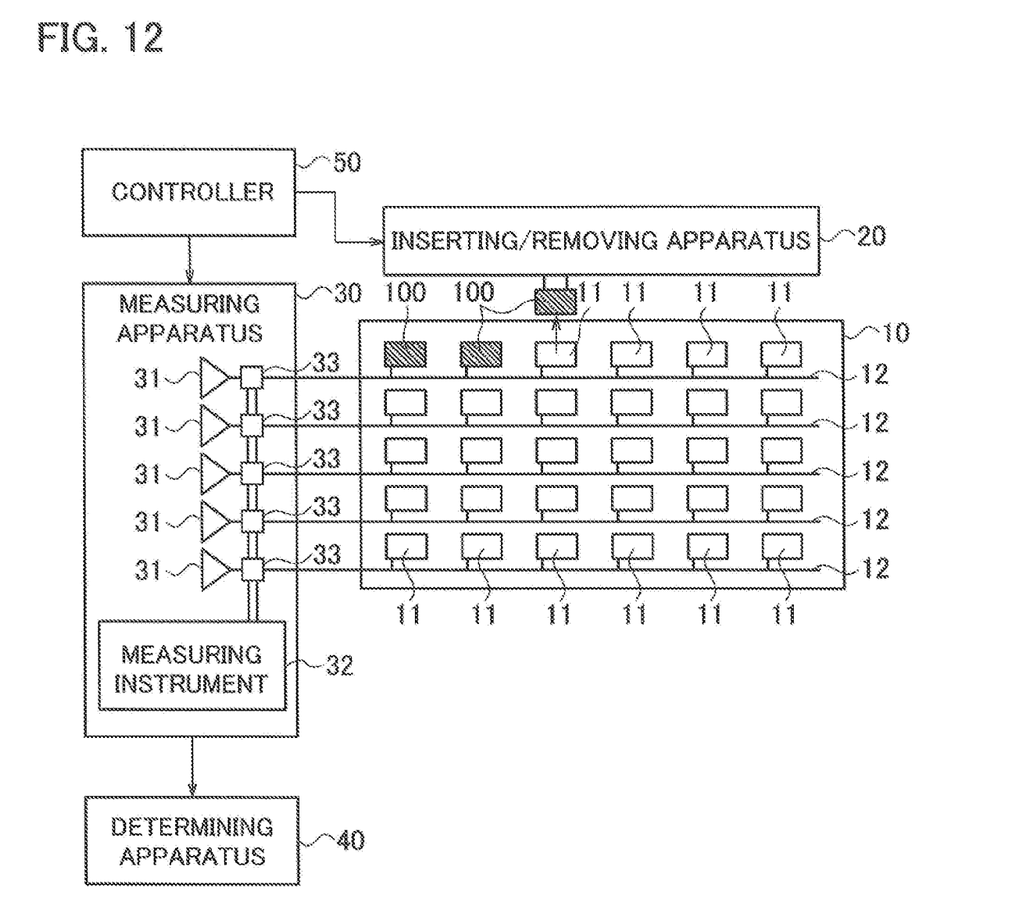
FIG. 12 is a schematic diagram illustrating a configuration of a test system according to a second embodiment.

A test system according to a second embodiment, which is illustrated in FIG. 12, executes the direct current test every time when one of the test target devices 100 is removed from the test socket 11. That is, the inserting/removing apparatus 20 removes the test target devices 100 from the test sockets 11 one by one, and reduces the test target devices 100 mounted on the test board 10. As illustrated by an arrow, FIG. 12 illustrates a stage of detaching, from the test board 10, a third test target device 100 from the last. Every time when the test target device 100 inserted into the test socket 11 is reduced, the measuring apparatus 30 executes the direct current test. The determining apparatus 40 compares a difference determination value and a change between measured values of the direct current tests, which is caused by the fact that the test target devices 100 inserted into the test sockets 11 are reduced by one, with each other, and determines whether or not the test target device 100 newly detached from the test socket 11 is acceptable.

Figure 13:
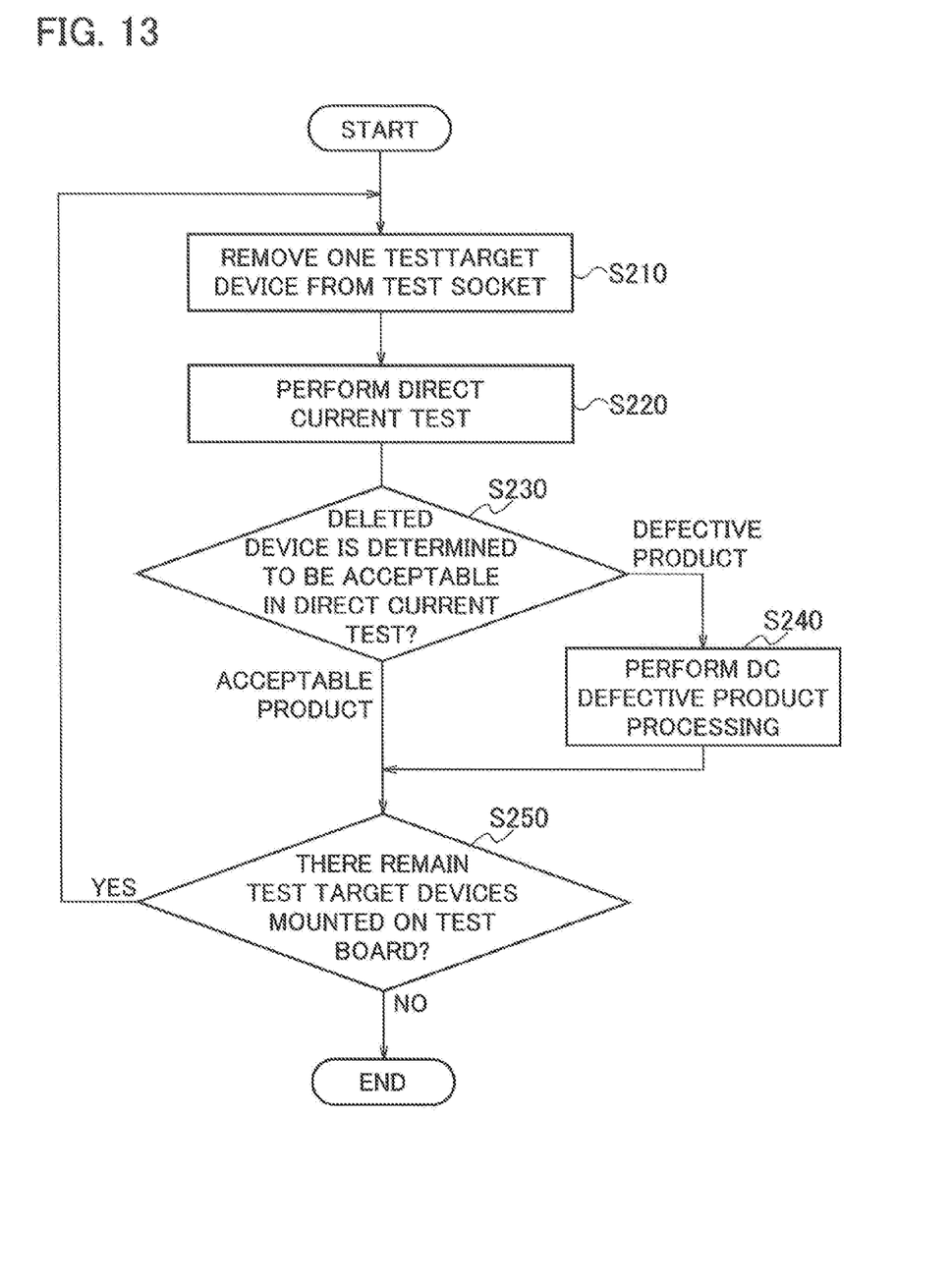
FIG. 13 is a flowchart for explaining a test method according to the second embodiment.

Referring to a flowchart illustrated in FIG. 13, a description will be given below of a test method by a test system according to the second embodiment.

First, in Step S210, the inserting/removing apparatus 20 removes one test target device 100 from the test socket 11, and detaches the test target device 100 from the test board 10. Then, in Step S220, the measuring apparatus 30 executes the direct current test for the test target devices 100 mounted on the test board 10. A measured value of the direct current test is transmitted to the determining apparatus 40.

In Step S230, on the basis of the measured value of the direct current test, the determining apparatus 40 determines whether or not such a test target device 100 (hereinafter, referred to as a "deleted device") detached from the test board 10 immediately before is acceptable. That is, the determining apparatus 40 calculates a change between a measured value of a latest direct current test, which is transmitted from the measuring apparatus 30, and a measured value of a previous direct current test, which is transmitted immediately therebefore. Then, the determining apparatus 40 compares a difference determination value and a change between measured values of the direct current tests, which is caused by the fact that the test target devices 100 inserted into the test sockets are reduced by one, with each other, thereby determining whether or not the deleted device newly detached from the test socket 11 is acceptable.

When the change between the measured values of the direct current tests exceeds a predetermined range of the difference determination value, the determining apparatus 40 determines that the deleted device is the DC defective product. In that case, the processing proceeds to Step S240, where DC defective product processing is performed. For example, the deleted device as the DC defective product detached from the test socket 11 is distinguished from the DC acceptable products, and is conveyed to the tray. Thereafter, the processing proceeds to Step S250.

Meanwhile, when the change between the measured values of the direct current tests remains within the range of the difference determination value, the determining apparatus 40 determines that the deleted device is the DC acceptable product. In that case, the processing proceeds to Step S250.

In Step S250, it is determined whether or not there remain such test target devices 100 mounted on the test board 10. When there remain the test target devices 100 mounted on the test board 10, the processing returns to Step S210, where the inserting/removing apparatus 20 newly detaches the test target device 100 from the test board 10, and the measuring apparatus 30 executes the direct current test therefor. Meanwhile, when there do not remain the test target devices 100 mounted on the test board 10, the processing is ended.

Figure 14:
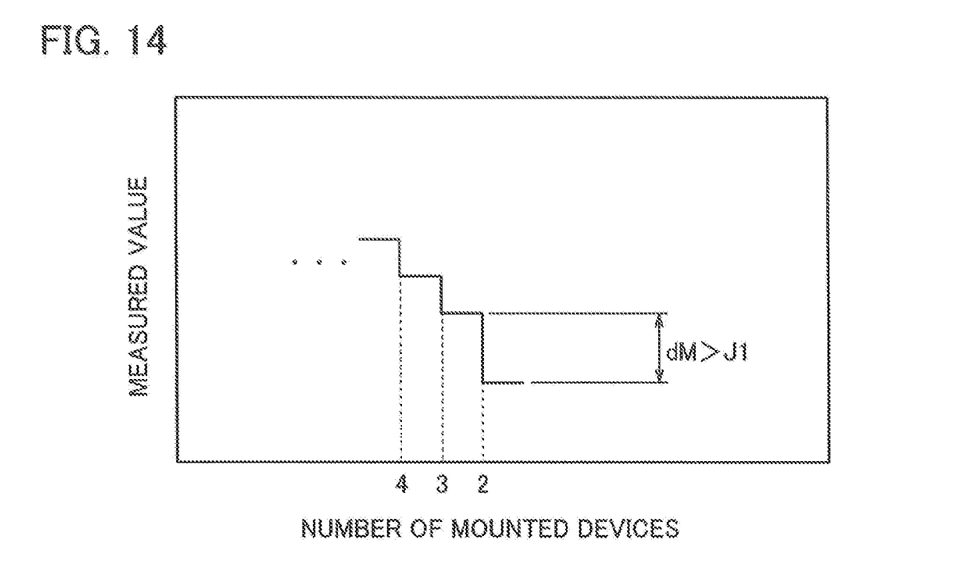
FIG. 14 is a graph illustrating an example of a measurement result by the test system according to the second embodiment.

When the change dM between the measured values of the direct current tests is larger than the difference determination value J1, the determining apparatus 40 determines that the deleted device is the DC defective product. FIG. 14 illustrates an example in which the test target device 100 detached as a second device from the last from the test board 10 is the DC defective product.

As described above, in the test system illustrated in FIG. 12, every time when the test target device 100 is detached from the test board 10, the direct current test is executed for the whole of all the test target devices 100 mounted on the test board 10 at that point of time. The measured values of the direct current tests before and after the test target device 100 is detached are compared with each other, thus making it possible to determine whether or not the direct current characteristics of the deleted test target device 100 are acceptable. That is, whether or not each of the test target devices 100 is acceptable can be determined by using the change between the measured values of the direct current tests, each of which is executed every time when one of the test target devices 100 is removed from the test socket 11.

Hence, in accordance with the test system according to the second embodiment, a defective product caused by the test using the test board 10, for example, a defective product caused by the burn-in test is specified at a stage of being detached from the test board 10, and the defective product can be prevented from proceeding to the following steps. Others are substantially similar to those of the first embodiment, and a duplicate description will be omitted.

Figure 15:
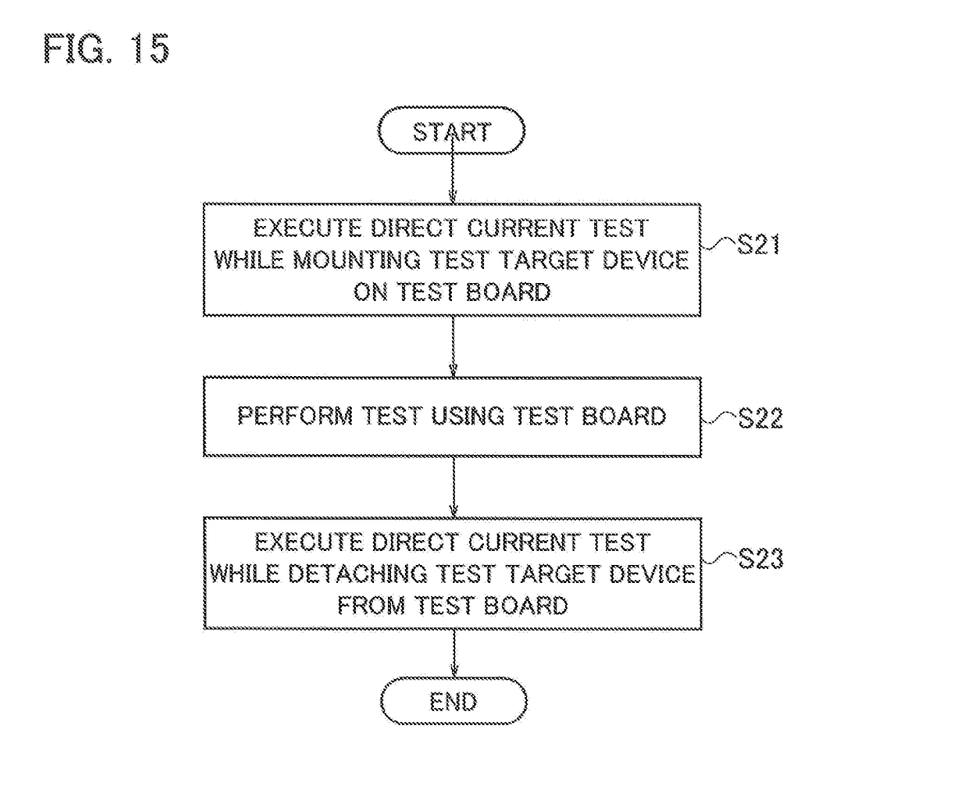
FIG. 15 is a flowchart illustrating an example of a test process that uses the test system according to the second embodiment.

Incidentally, the test by the test system according to the second embodiment may be combined with the test by the test system according to the first embodiment as illustrated in FIG. 15. In a test process illustrated in FIG. 15, in Step S21, the direct current test is executed while mounting the test target device 100 on the test board 10. Thereafter, in Step S22, a test is performed for the test target devices 100 mounted on the test board 10. For example, a burn-in test in which a temperature and an operation time are set to predetermined conditions is performed. Thereafter, in Step S23, the direct current test is executed while detaching the test target devices 100 from the test board 10. Thus, the DC defective product is prevented from getting mixed into the test using the test board 10, and further, the test target device 100 as such a defective product can be prevented from proceeding to the following steps. Note that the direct current test at the time of detaching the test target device 100 may be executed without using the direct current test at the time of mounting the test target device 100.

Other Embodiments

Figure 16:
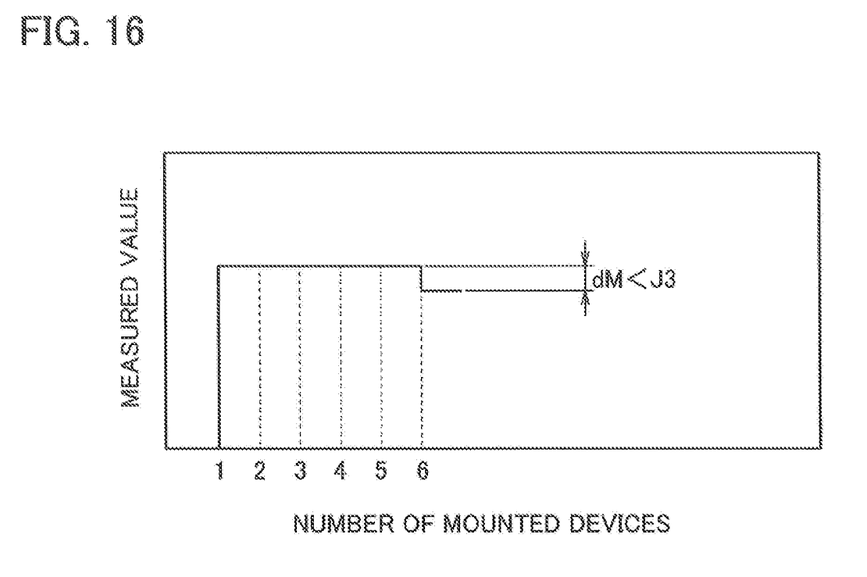
FIG. 16 is a graph illustrating an example of a measurement result according to another embodiment.

In the above description, the examples in each of which current values are measured by the direct current tests by the measuring apparatus 30; however, voltage values may be measured by the direct current tests. For example, the direct current tests are performed for terminals at which a constant voltage value is measured in the DC acceptable products. In this case, when the test target device 100 newly mounted on the test board 10 is the DC acceptable product, the measured value of the direct current test does not change. Meanwhile, when the DC defective product is newly mounted on the test board 10, the measured value changes as illustrated in FIG. 16. In an example illustrated in FIG. 16, a change dM between measured values of a fifth direct current test and a sixth direct current test is larger than a predetermined difference determination value J3, and a test target device 100 added as a sixth device is such a DC defective product in which a voltage of a terminal as a test target is lower than a predetermined voltage value.

Moreover, the description is given above of the cases in each of which the measuring apparatus 30 is controlled by the controller 50; however, the measuring apparatus 30 may be controlled by other methods. For example, every time when the test target device 100 is inserted or removed into or from the test socket 11, the measuring apparatus 30 may be controlled by a signal from the inserting/removing apparatus 20 to execute the direct current test. As described above, the inserting/removing apparatus 20 may have a function of the controller 50.

Figure 17:
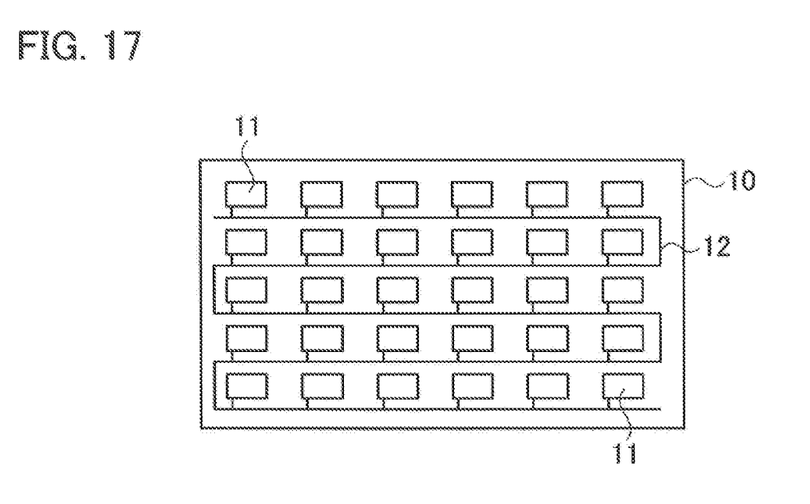
FIG. 17 is a schematic diagram illustrating a configuration of a test board of a test system according to such another embodiment.

Moreover, the board wiring 12 of the above-described test board 10 has a configuration in which the plurality of branch wirings, each having the plurality of test sockets 11 connected in series to one another, are connected in parallel to one another. However, as illustrated in FIG. 17, all the test sockets 11 may be connected in series to one another by one board wiring 12.

While certain embodiments have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A test system comprising:
a test board on which a plurality of test target devices are mounted while being sequentially connected to one another;
a measuring apparatus configured to simultaneously execute direct current tests for the test target devices mounted on the test board every time when a number of the test target devices mounted on the test board changes; and
a determining apparatus configured to determine whether or not the test target devices are acceptable based on a change between measured values of the direct current tests, the change following the change of the number of the test target devices mounted on the test board, wherein the measuring apparatus executes each of the direct current tests every time when the test target devices mounted on the test board are increased, and wherein the determining apparatus compares a difference determination value and a change between measured values of the direct current tests, the change being caused by a fact that the test target devices mounted on the test board are increased by one, with each other, and determines whether or not the test target device newly mounted on the test board is acceptable.

2. The test system according to claim 1,
wherein the test target device determined to be a defective product is detached from the test board.

3. The test system according to claim 1, wherein the mounting of the test target device newly mounted on the test board is redone on the test board in response to the measured values of the direct current tests.

4. The test system according to claim 1,
wherein a plurality of test sockets sequentially connected to one another are arranged on the test board, and
wherein the test system further comprises an inserting/removing apparatus configured to insert and remove the test target devices into and from the test sockets one by one.

5. The test system according to claim 4, wherein the inserting/removing apparatus removes, from the test socket, the test target device newly mounted on the test board and determined to be a defective product.

6. The test system according to claim 4, wherein the inserting/removing apparatus redoes the mourning of the test target device newly mounted on the test board on the test board in response to the measured values of the direct current tests.

7. The test system according to claim 1,
wherein the direct current test includes at least any of a power supply current test, a voltage application current measurement for an input/output terminal, and a current application voltage measurement for the input/output terminal, and
wherein the measuring apparatus measures the measured values of the direct current tests as a total sum of the measured values of all the test target devices mounted on the test board at a time of executing the direct current test.

8. The test system according to claim 1,
wherein the measuring apparatus includes:
a driver configured to supply the test target devices with an electrical signal; and
a measuring instrument configured to measure the measured values of the direct current tests.

9. A test system comprising:
a test board on which a plurality of test target devices are mounted while being sequentially connected to one another,
a measuring apparatus configured to simultaneously execute direct current tests for the test target devices mounted on the test board every time when a number of the test target devices mounted on the test board changes, and
a determining apparatus configured to determine whether or not the test target devices are acceptable based on a change between measured values of the direct current tests, the change following the change of the number of the test target devices mounted on the test board,
wherein the measuring apparatus executes each of the direct current tests every time when the test target devices mounted on the test board are reduced, and wherein the determining apparatus compares a difference determination value and a change between measured values of the direct current tests, the change being caused by a fact that the test target devices mounted on the test board are reduced by one, with each other, and determines whether or not the test target device newly detached from the test board is acceptable.

10. A test method comprising:
preparing a test board on which a plurality of test target devices are mounted while being sequentially connected to one another;
simultaneously executing direct current tests for the test target devices mounted on the test board every time when a number of the test target devices mounted on the test board changes;
determining whether or not the test target devices are acceptable based on a change between measured values of the direct current tests, the change following the change of the number of the test target devices mounted on the test board;
executing each of the direct current tests every time when the test target devices mounted on the test board are increased; and
comparing a difference determination value and a change between measured values of the direct current tests, the change being caused by a fact that the test target devices mounted on the test board are increased by one, with each other, and determining whether or not the test target device newly mounted on the test board is acceptable.

11. The test method according to claim 10, wherein the test target devices are inserted and removed into and from test sockets one by one by using an inserting/removing apparatus, the test sockets being arranged on the test board.

12. The test method according to claim 10, wherein the test target device determined to be a defective product is detached from the test board.

13. The test method according to claim 10, wherein the mounting of the test target device newly mounted on the test board is redone on the test board in response to the measured values of the direct current tests.

14. The test method according to claim 10,
wherein the direct current test includes at least any of a power supply current test, a voltage application current measurement for an input/output terminal, and a current application voltage measurement for the input/output terminal, and
the test method includes measuring the measured values of the direct current tests as a total sum of the measured values of all the test target devices mounted on the test board at a time of executing the direct current test.

15. A test method comprising:
preparing a test board on which a plurality of test target devices are mounted while being sequentially connected to one another;
simultaneously executing direct current tests for the test target devices mounted on the test board every time when a number of the test target devices mounted on the test board changes;
determining whether or not the test target devices are acceptable based on a change between measured values of the direct current tests, the change following the change of the number of the test target devices mounted on the test board;
executing each of the direct current tests every time when the test target devices mounted on the test board are reduced; and comparing a difference determination value and a change between measured values of the direct current tests, the change being caused by a fact that the test target devices mounted on the test board are reduced by one, with each other, and determining whether or not the test target device newly detached from the test board is acceptable.

* * * * *